(12) United States Patent
Park et al.

(10) Patent No.: US 11,776,653 B2
(45) Date of Patent: Oct. 3, 2023

(54) MEMORY DEVICE

(71) Applicant: SK hynix Inc., Icheon-si (KR)

(72) Inventors: Ji Hwan Park, Icheon-si (KR); Sang Muk Oh, Icheon-si (KR); Byung Kuk Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 161 days.

(21) Appl. No.: 17/557,876

(22) Filed: Dec. 21, 2021

(65) Prior Publication Data

US 2022/0115083 A1    Apr. 14, 2022

Related U.S. Application Data

(63) Continuation-in-part of application No. 17/077,802, filed on Oct. 22, 2020, now Pat. No. 11,521,696.

(30) Foreign Application Priority Data

Mar. 17, 2020   (KR) ........................ 10-2020-0032629

(51) Int. Cl.
| | |
|---|---|
| *G11C 29/00* | (2006.01) |
| *G11C 29/42* | (2006.01) |
| *G11C 29/44* | (2006.01) |
| *G11C 8/18* | (2006.01) |
| *G11C 29/12* | (2006.01) |

(52) U.S. Cl.
CPC ............ *G11C 29/42* (2013.01); *G11C 8/18* (2013.01); *G11C 29/1201* (2013.01); *G11C 29/12015* (2013.01); *G11C 29/4401* (2013.01)

(58) Field of Classification Search
CPC ............... G11C 29/42; G11C 29/1201; G11C 29/12015; G11C 29/4401; G11C 8/18
See application file for complete search history.

(56) References Cited

U.S. PATENT DOCUMENTS

| | | | |
|---|---|---|---|
| 6,658,612 B1 | 12/2003 | Park et al. | |
| 9,454,422 B2 | 9/2016 | Coteus et al. | |
| 9,823,956 B2 | 11/2017 | Kim et al. | |
| 2009/0222713 A1* | 9/2009 | Shin | H03M 13/091 |
| | | | 714/E11.032 |
| 2014/0003170 A1 | 1/2014 | Ku | |
| 2017/0140808 A1* | 5/2017 | Jung | G11C 11/4093 |
| 2020/0058344 A1* | 2/2020 | Vankayala | G11C 11/4076 |
| 2020/0110645 A1 | 4/2020 | Rajgopal et al. | |

FOREIGN PATENT DOCUMENTS

| | | |
|---|---|---|
| KR | 100546345 B1 | 1/2006 |
| KR | 1020150025801 A | 3/2015 |

* cited by examiner

*Primary Examiner* — Christine T. Tu
(74) *Attorney, Agent, or Firm* — WILLIAM PARK & ASSOCIATES LTD.

(57) ABSTRACT

Disclosed is a memory device including an error logic unit suitable for determining whether an error is present in command signals to generate a command error signal; a replica delay circuit suitable for replicating a delay value of the error logic unit and generating an input strobe signal by delaying a strobe signal of the command signals; an output strobe signal generation circuit suitable for generating an output strobe signal activated after a command error latency elapses from a time point at which the command signals are received; and a pipe circuit suitable for receiving and storing the command error signal in response to the input strobe signal and outputting the stored command error signal in response to the output strobe signal.

16 Claims, 14 Drawing Sheets

MEMORY DEVICE

CROSS-REFERENCE TO RELATED APPLICATION(S)

The present application is a continuation-in-part application of U.S. patent application Ser. No. 17/077,802 filed on Oct. 22, 2020 which claims priority under 35 U.S.C. § 119(a) to Korean Patent Application No. 10-2020-0032629, filed on Mar. 17, 2020, which is incorporated herein by reference in its entirety.

BACKGROUND

1. Field

Embodiments of the present disclosure relate to a memory device, and more particularly, to a memory device that receives test data through a test data input pad.

2. Description of the Related Art

With the rapid development of semiconductor memory technology, a high level of integration and performance is demanded in packaging semiconductor memory devices. To meet this demand, researchers and the industry are developing diverse technologies related to a three-dimensional structure in which a plurality of semiconductor memory chips are vertically stacked, rather than a two-dimensional structure in which semiconductor memory chips are planarly disposed on a printed circuit board (PCB) using wires or bumps.

Also, as the operation speeds of semiconductor memory devices increase, a semiconductor memory system of a System-In-Package (SIP) form in which a memory controller, such as a Central Processing Unit (CPU) or a Graphic Processing Unit (GPU), and a semiconductor memory device are integrated into one package is widely used. Because the pads of a semiconductor memory device of the stacked structure or the SIP structure are not exposed to the outside of the semiconductor memory device, it is difficult to perform a direct test by using a pin of test equipment.

Therefore, a semiconductor memory device may be provided with an additional pad for testing. Inevitably, the number of test pads of an integrated and miniaturized semiconductor memory device may be limited, resulting in a need to develop a technology capable of testing a semiconductor memory device with a limited number of test pads.

SUMMARY

Various embodiments of the present teachings are directed to a data input circuit capable of setting and copying input data in diverse patterns, and a memory device including the data input circuit.

In accordance with an embodiment of the present disclosure, a memory device includes a plurality of data input pads and at least one test data input pad. The memory device also includes a plurality of data input circuits corresponding to a plurality of channels, respectively, the plurality of data input circuits suitable for transmitting respective data received through the data input pads to the corresponding channels. The memory device further includes a test control circuit suitable for selecting at least one data input circuit among the plurality of data input circuits based on test mode information and suitable for controlling the selected data input circuit to transmit set data to the corresponding channel, during a test operation.

In accordance with another embodiment of the present disclosure, a memory device includes at least one test data input pad. The memory device also includes a test control circuit suitable for generating a first control signal and a plurality of second control signals based on test mode information in response to a test enable signal which is activated during a test operation. The memory device further includes a plurality of data input circuits corresponding to a plurality of channels, respectively, the plurality of data input circuits suitable for transmitting set data or test data received through the at least one test data input pad to the corresponding channels in response to the first control signal and the plurality of second control signals, respectively.

In accordance with yet another embodiment of the present disclosure, a memory device includes a base die and a plurality of core dies stacked over the base die. The base die includes at least one test data input pad. The base die also includes a plurality of data input circuits suitable for copying test data received through the at least one test data input pad and suitable for transmitting the copied test data to the core dies during a test operation. The base die further includes a test control circuit suitable for selecting at least one data input circuit among the plurality of data input circuits based on test mode information and suitable for controlling the selected data input circuit to transmit set data to the core dies during the test operation.

In accordance with an embodiment of the present disclosure, a memory device may include: an error logic unit suitable for determining whether an error is present in command signals to generate a command error signal; a replica delay circuit suitable for replicating a delay value of the error logic unit and generating an input strobe signal by delaying a strobe signal of the command signals; an output strobe signal generation circuit suitable for generating an output strobe signal activated after a command error latency elapses from a time point at which the command signals are received; and a pipe circuit suitable for receiving and storing the command error signal in response to the input strobe signal and outputting the stored command error signal in response to the output strobe signal.

In accordance with an embodiment of the present disclosure, a memory device may include: an error logic unit suitable for determining whether an error is present in data to generate a data error signal; a replica delay circuit suitable for replicating a delay value of the error logic unit and generating an input strobe signal by delaying a strobe signal of the data; an output strobe signal generation circuit suitable for generating an output strobe signal activated after a data error latency elapses from a time point at which a write command corresponding to the data is received; and a pipe circuit suitable for receiving and storing the data error signal in response to the input strobe signal and outputting the stored data error signal in response to the output strobe signal.

In accordance with an embodiment of the present disclosure, a memory device may include: a command error logic unit suitable for determining whether an error is present in command signals to generate a command error signal; a command replica delay circuit suitable for replicating a delay value of the command error logic unit and generating a command input strobe signal by delaying a strobe signal of the command signals; a command output strobe signal generation circuit suitable for generating a command output strobe signal activated after a command error latency elapses from a time point at which the command signals are received; a command pipe circuit suitable for receiving and storing the command error signal in response to the command input strobe signal and outputting the stored command error signal in response to the command output strobe signal; a data error logic unit suitable for determining whether an error is present in data, and generating a data error signal; a data replica delay circuit suitable for replicating a delay value of the data error logic unit and generating a data input strobe signal by delaying a strobe signal of the data; a data output strobe signal generation circuit suitable for generating a data output strobe signal activated after a data error latency elapses from a time point at which a write command corresponding to the data is received; and a data pipe circuit suitable for receiving and storing the data error signal in response to the data input strobe signal and outputting the stored data error signal in response to the data output strobe signal.

In accordance with an embodiment of the present disclosure, a memory device may include: a plurality of channel regions; a plurality of data input pads and at least one test data input pad; a plurality of data input circuits corresponding to the respective channel regions and each suitable for transferring data from the plurality of data input pads to a corresponding channel region of the channel regions; and a test control circuit suitable for selecting at least one of the plurality of data input circuits according to test mode information and controlling the selected data input circuit to transmit the data to a corresponding channel region of the channel regions, during a test operation, wherein at least one of the plurality of channel regions includes: an error logic unit suitable for determining whether an error is present in the data transmitted thereto to generate a data error signal; a replica delay circuit suitable for replicating a delay value of the error logic unit and generating an input strobe signal by delaying a strobe signal of the data transmitted thereto; an output strobe signal generation circuit suitable for generating an output strobe signal activated after a data error latency elapses from a time point at which a write command corresponding to the data transmitted thereto is received; and a pipe circuit suitable for receiving and storing the data error signal in response to the input strobe signal and outputting the stored data error signal in response to the output strobe signal.

In accordance with an embodiment of the present disclosure, a memory device may include: an error detection circuit suitable for generating an error signal when detecting an error from a command; and a synchronizing circuit suitable for keeping the error signal stored therein during a section between first and second timings, wherein the first timing is delayed from receiving a strobe signal of the command by an amount of a delay value of the error detection circuit, and wherein the second timing is delayed from receiving the command by an amount of a command error latency.

In accordance with an embodiment of the present disclosure, a memory device may include: an error detection circuit suitable for generating an error signal when detecting an error from data; and a synchronizing circuit suitable for keeping the error signal stored therein during a section between first and second timings, wherein the first timing is delayed from receiving a strobe signal of the data by an amount of a delay value of the error detection circuit, and wherein the second timing is delayed from receiving a write command of the data by an amount of a data error latency.

DETAILED DESCRIPTION

Figure 1:
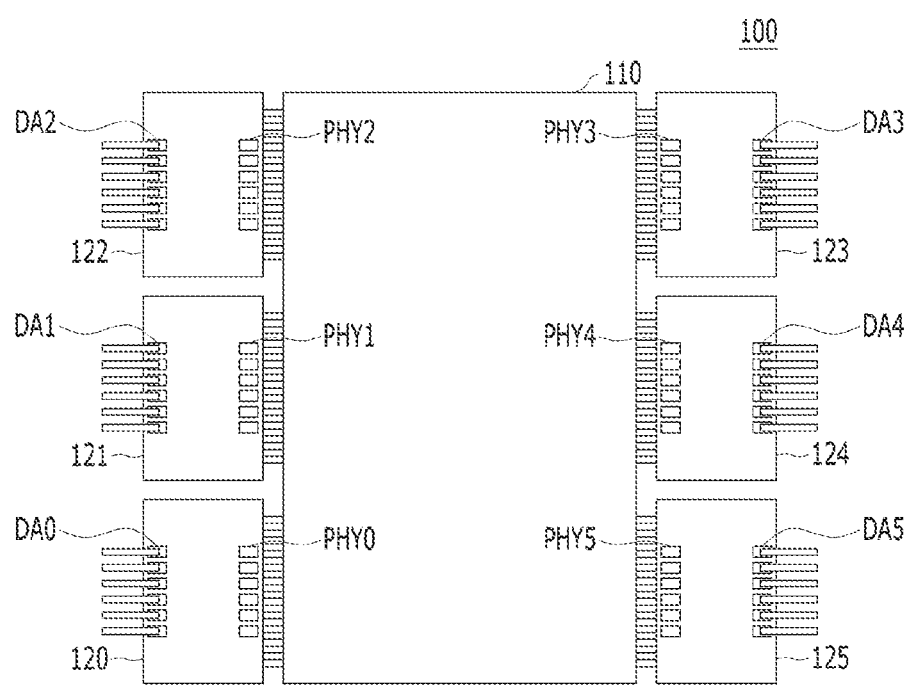
FIG. 1 is a plan view illustrating a memory system in accordance with an embodiment of the present disclosure.

Embodiments of the present teachings will be described below in detail with reference to the accompanying drawings. The present teachings may, however, be embodied in different forms and should not be construed as being limited to the embodiments set forth herein. Rather, these embodiments are provided so that this disclosure will be enabling to those skilled in the art. Throughout this disclosure, like reference numerals refer to like parts throughout the various figures and embodiments of the present teachings.

FIG. 1 is a plan view illustrating a memory system 100 in accordance with an embodiment of the present disclosure.

Referring to FIG. 1, the memory system 100 may have a System-In-Package (SIP) structure. The memory system 100 may include a controller 110 and a plurality of memory devices 120, 121, 122, 123, 124, and 125.

The controller 110 may include a Central Processing Unit (CPU), a Graphics Processing Unit (GPU), a Digital Signal Processor (DSP), an Application Processor (AP), a memory controller chip, and the like. Diverse types of processing units may be included in the controller 110 in the form of a System-On-Chip (SoC). Namely, the controller 110 may represent one chip in which diverse systems are integrated.

Each of the memory devices 120 to 125 may include a plurality of integrated circuit chips. The integrated circuit chips may be stacked on one another and electrically connected using through silicon vias (TSVs). The memory devices 120 to 125 may be formed of high bandwidth memory (HBM) in which a bandwidth is increased by increasing the number of input/output units.

However, the present teachings are not limited thereto, and the memory devices 120 to 125 are not only volatile memory devices using memory such as Dynamic Random Access Memory (DRAM), but also non-volatile memory devices, such as a flash memory device, a Phase Change Random Access Memory device (PCRAM), and a Resistive Random Access Memory device (ReRAM), a ferroelectric memory device (FeRAM), a Magnetic Random Access Memory device (MRAM), a Spin Transfer Torque Random Access Memory device (STTRAM), or the like. Alternatively, the memory devices 120 to 125 may be formed as a combination of two or more of the volatile memory devices and the non-volatile memory devices.

The controller 110 and the memory devices 120 to 125 may be stacked over an interposer. The controller 110 and the memory devices 120 to 125 may communicate with each other through a signal path formed in the interposer. For communication with the controller 110, the memory devices 120 to 125 may include PHY interfaces PHY0, PHY1, PHY2, PHY3, PHY4, and PHY5 that are coupled to the interposer through micro bumps. However, it may be difficult to test the memory devices 120 to 125 through the PHY interfaces PHY0 to PHY5 because the physical size of the micro bumps is very small and the number of the micro bumps is more than approximately 1000.

Therefore, the memory devices 120 to 125 may include Direct Access (DA) interfaces DA0, DA1, DA2, DA3, DA4, and DA5 for directly accessing and testing the memory devices 120 to 125, respectively, from the outside of the memory devices 120 to 125. The DA interfaces DA0 to DA5 may be interfaced through the direct access pads having a relatively larger physical size and less in number than micro bumps and may be used for testing.

Figure 2:
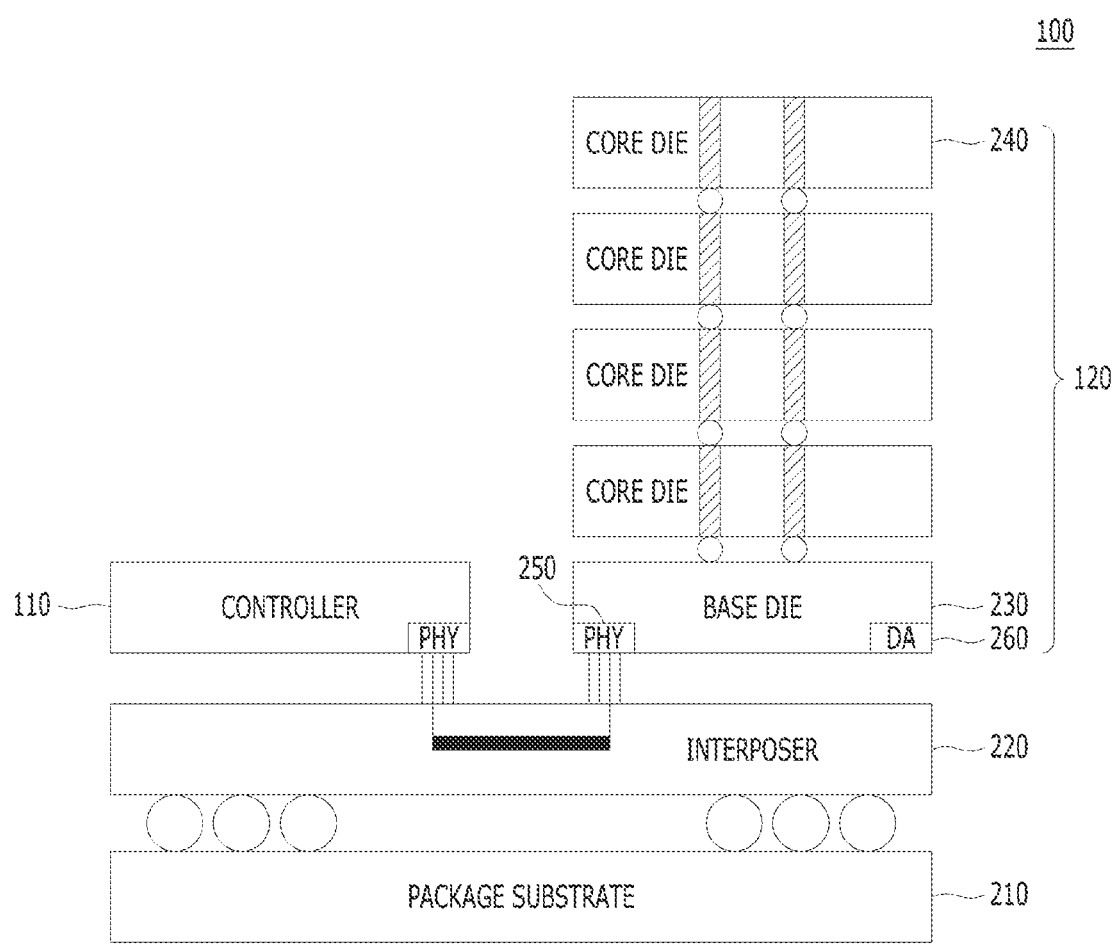
FIG. 2 is a cross-sectional view illustrating the memory system shown in FIG. 1 in accordance with an embodiment of the present disclosure.

FIG. 2 is a cross-sectional view illustrating the memory system 100 shown in FIG. 1 in accordance with an embodiment of the present disclosure.

FIG. 2 shows a structure in which the controller 110 and the first memory device 120 among the memory devices 120 to 125 are stacked. Although not illustrated in FIG. 2, the second to sixth memory devices 121 to 125 may also have a stacked structure which is similar to that of the first memory device 120.

The memory system 100 may further include a package substrate 210 and an interposer 220 which is stacked over the package substrate 210. The interposer 220 may be stacked over the package substrate 210 or coupled to the package substrate 210 through an electrical connection means, such as a bump ball, a ball grid array, and the like. The controller 110 and the first memory device 120 may also be stacked over the interposer 220 and electrically connected to the interposer 220 through a micro bump.

The first memory device 120 may include a plurality of integrated circuit chips 230 and 240 that are stacked on one another. The integrated circuit chips 230 and 240 may be electrically connected to each other through micro bumps and through silicon vias (TSVs) formed vertically penetrating the inside of the integrated circuits 230 and 240 to transmit and receive signals.

The integrated circuit chips 230 and 240 may include a base die 230 and a number of core dies 240. The core dies 240 may be provided with data storage space, such as a memory cell array for storing data and a memory register. On the other hand, circuits for transmitting signals between the core dies 240 and the controller 110 may be disposed in the base die 230.

As described above, the first memory device 120 may communicate with the controller 110 through the PHY interface 250 coupled to the micro bumps. Also, the first memory device 120 may be directly accessed and tested from the outside of the first memory device 120 through the DA interface 260 formed of direct access pads. The direct access pads may be provided in a relatively larger size and be smaller in number than the micro bumps.

Figure 3:
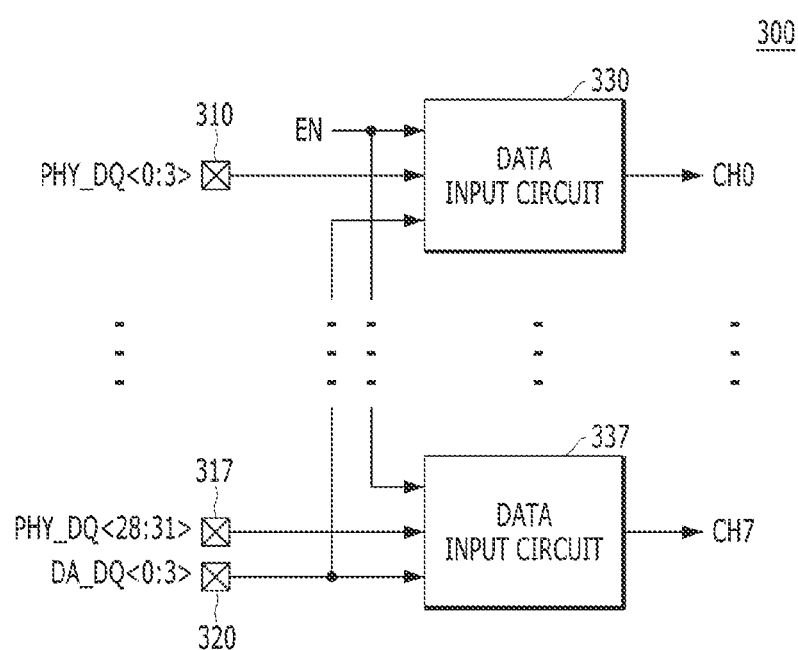
FIG. 3 is a block diagram illustrating a memory device shown in FIG. 1 in accordance with an embodiment of the present disclosure.

FIG. 3 is a block diagram illustrating a memory device 300 shown in FIG. 1 in accordance with an embodiment of the present disclosure.

FIG. 3 shows a base die of the memory device 300, and it shows a portion related to a DA interface and a PHY interface. The memory device 300 may include a plurality of data input pads 310 to 317, at least one test data input pad 320, and a plurality of data input circuits 330 to 337. The data input pads 310 to 317 may include a micro bump pad as the PHY interface. In a normal operation, data PHY_DQ<0:31> may be inputted from a host through the data input pads 310 to 317.

The at least one test data input pad 320 may include a direct access pad as a DA interface. During a test operation, test data DA_DQ<0:3> may be inputted from the outside of the memory device 300 through the at least one test data input pad 320.

The data input circuits 330 to 337 may correspond to a plurality of channels CH0 to CH7, respectively. In a normal operation, the data input circuits 330 to 337 may transmit the data PHY_DQ<0:31> received by the data input pads 310 to 317 to the corresponding channels, respectively.

During a test operation, the data input circuits 330 to 337 may transmit the test data DA_DQ<0:3> received by the at least one test data input pad 320 to the corresponding channels in response to a test enable signal EN. When the test enable signal EN is activated during the test operation, the data input circuits 330 to 337 may transmit the test data DA_DQ<0:3> received by the at least one test data input pad 320 to the channels CH0 to CH7 instead of the data PHY_DQ<0:31> received by the data input pads 310 to 317.

As described above, the at least one test data input pad 320 may be relatively large in size and small in number compared to the data input pads 310 to 317. Accordingly, during the test operation, the data input circuits 330 to 337 may copy the test data DA_DQ<0:3> received through the at least one test data input pad 320 and transmit the same data to the channels CH0 to CH7.

In the test operation, the memory device 300 may transfer the test data DA_DQ<0:3> to core dies through the channels CH0 to CH7. Data transferred to the core dies may be stored in memory cells included in the core dies. Herein, the memory device 300 may perform an error correction code (ECC) operation to detect and correct errors occurring in the data stored in the memory cells.

For example, the memory device 300 may generate parity data by performing an ECC encoding operation on the test data DA_DQ<0:3>, and store a codeword formed of the test data DA_DQ<0:3> and the parity data in memory cells. The memory device 300 may perform an ECC decoding operation on the data that are read from the memory cells and detect and correct errors occurring in the data stored in the memory cells based on the parity data.

During the test operation, an ECC operation of the memory device 300 may also be tested. The memory device 300 may check whether the ECC operation is normally performed or not based on the logic level of the parity data generated through the ECC operation. However, when data of the same pattern is used by copying the test data DA_DQ<0:3>, the parity data may also be generated in a uniform pattern. Therefore, it may be difficult to accurately test the ECC operation of the memory device 300.

Figure 4:
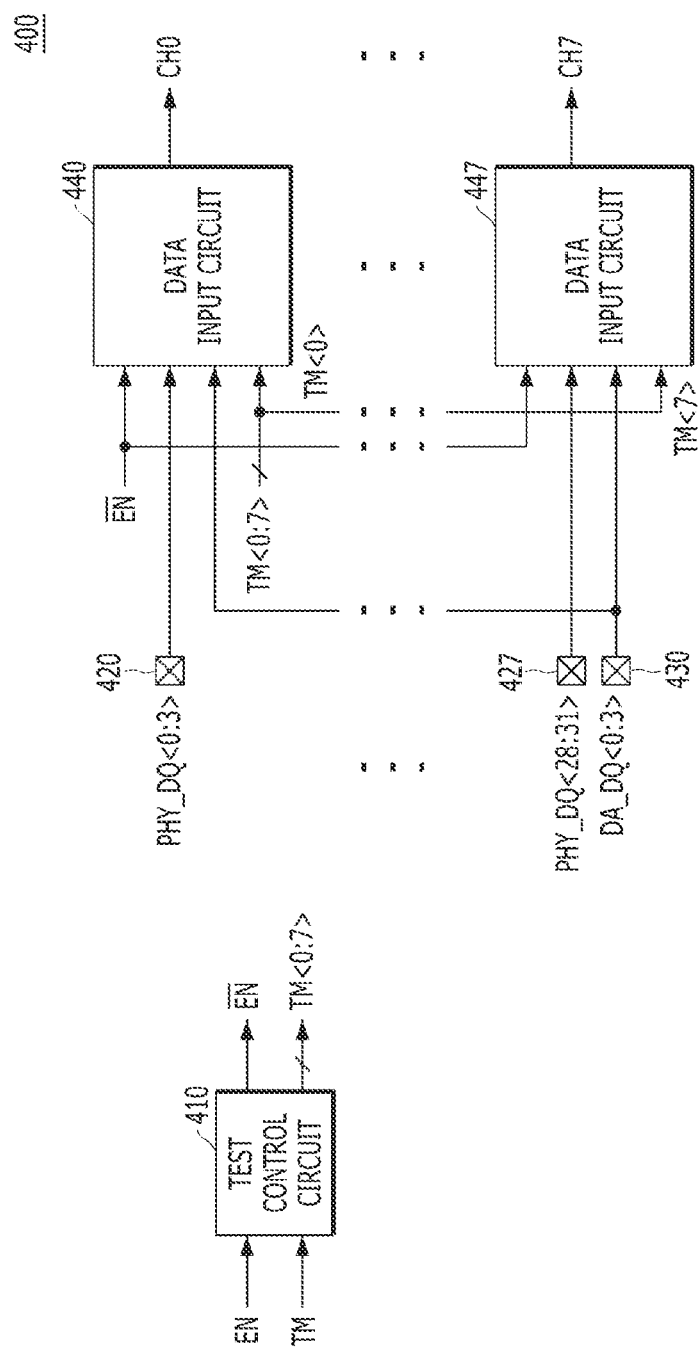
FIG. 4 is a block diagram illustrating a memory device in accordance with an embodiment of the present disclosure.

FIG. 4 is a block diagram illustrating a memory device 400 in accordance with an embodiment of the present disclosure.

FIG. 4 shows a base die of the memory device 400, and FIG. 4 shows a portion related to the DA interface and the PHY interface. The memory device 400 may include a test control circuit 410, a plurality of data input pads 420 to 427, at least one test data input pad 430, and a plurality of data input circuits 440 to 447.

The data input pads 420 to 427 may include a micro bump pad as a PHY interface. In a normal operation, data PHY_DQ<0:31> may be inputted from a host through the data input pads 420 to 427.

The at least one test data input pad 430 may include a direct access pad as a DA interface. During a test operation, test data DA_DQ<0:3> may be inputted from the outside of the memory device 400 through the at least one test data input pad 430.

The data input circuits 440 to 447 may correspond to channels CH0 to CH7, respectively. In a normal operation, the data input circuits 440 to 447 may transmit the data PHY_DQ<0:31> received by the data input pads 420 to 427 to the corresponding channels, respectively.

In a test operation, the test control circuit 410 may generate a first control signal $\overline{EN}$ and a plurality of second control signals TM<0:7> based on test mode information TM in response to a test enable signal EN. Herein, the test enable signal EN may represent a signal that is activated during a test operation. The test mode information TM may be stored as a predetermined value in a mode register set, or the like, or the test mode information TM may be generated by combining addresses inputted from the outside of the memory device 400 during a test operation.

To be specific, the test control circuit 410 may generate the first control signal $\overline{EN}$ by inverting the test enable signal EN. When the test enable signal EN is activated, the test control circuit 410 may select at least one signal among the second control signals TM<0:7> according to the code value of the test mode information TM and generate the first control signal $\overline{EN}$ to have a different logic level from the logic levels of the other signals. For example, the test control circuit 410 may activate the other signals while deactivating the at least one selected signal among the second control signals TM<0:7>. As the at least one selected signal among the second control signals TM<0:7> is activated, the other signals may be deactivated, which may be realized differently according to an embodiment of the present teachings.

During a test operation, the data input circuits 440 to 447 may transmit set data or the test data DA_DQ<0:3> received through the at least one test data input pad 430 to the corresponding channels, respectively, in response to the first control signal $\overline{EN}$ and the second control signals TM<0:7>. The data input circuit corresponding to the signal selected from the second control signals TM<0:7> among the data input circuits 440 to 447 may transmit the set data to the corresponding channel. On the other hand, the data input circuits corresponding to the other signals of the second control signals TM<0:7> among the data input circuits 440 to 447 may transmit the test data DA_DQ<0:3> to the corresponding channels.

Accordingly, during a test operation, the test control circuit 410 may select at least one data input circuit among the data input circuits 440 to 447 and control the selected data input circuit to transmit the set data to the corresponding channel by using the first control signal $\overline{EN}$ and the second control signals TM<0:7>. The test control circuit 410 may control the other data input circuits among the data input circuits 440 to 447 except the selected data input circuit to transmit the test data DA_DQ<0:3> to the corresponding channels.

Figure 5:
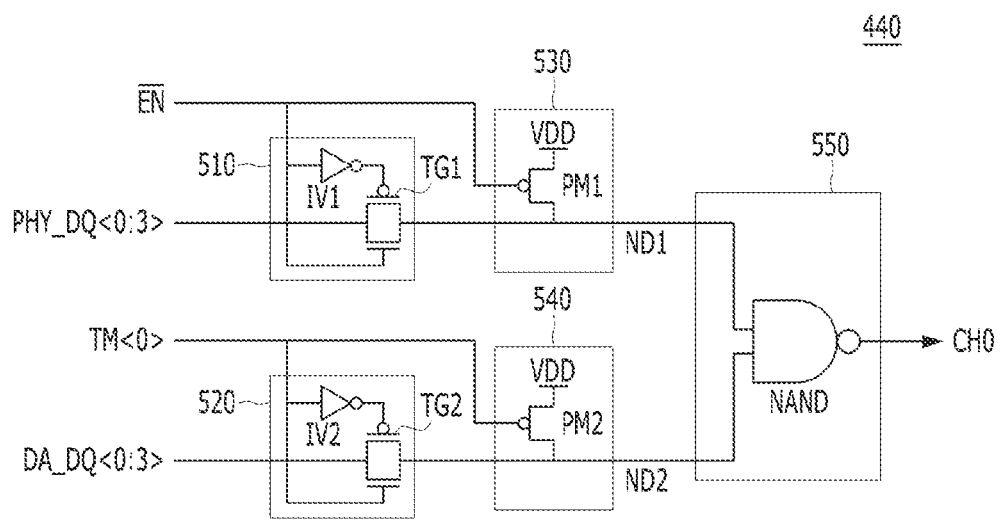
FIG. 5 is a block diagram illustrating a data input circuit shown in FIG. 4 in accordance with an embodiment of the present disclosure.

FIG. 5 is a block diagram illustrating the data input circuit 440 shown in FIG. 4 in accordance with an embodiment of the present disclosure.

The data input circuit 440 may include a first transmitter 510, a second transmitter 520, a first driver 530, a second driver 540, and a signal combining unit 550. Although FIG. 5 illustrates one of the data input circuits 440 to 447 shown in FIG. 4, all of the data input circuits 440 to 447 of FIG. 4 may have similar structures with only a difference in their input and output signals.

The first transmitter 510 may transmit the data PHY_DQ<0:3> received by the corresponding data input pad 420 among the data input pads 420 to 427 in response to the first control signal $\overline{EN}$ to a first node ND1. The first transmitter 510 may include a first inverter IV1 and a first transfer gate TG1. The first inverter IV1 may invert and output the first control signal $\overline{EN}$, and the first transfer gate TG1 may output the data PHY_DQ<0:3> to the first node ND1 in response to the first control signal $\overline{EN}$ and the output signal of the first inverter IV1.

The second transmitter 520 may transmit the test data DA_DQ<0:3> received through the at least one test data input pad 430 to the second node ND2 in response to the corresponding second control signal TM<0> among the second control signals TM<0:7>. The second transmitter 520 may include a second inverter IV2 and a second transfer gate TG2. The second inverter IV2 may invert and output the corresponding second control signal TM<0>, and the second transfer gate TG2 may output the test data DA_DQ<0:3> to the second node ND2 in response to the corresponding second control signal TM<0> and the output signal of the second inverter IV2.

The first driver 530 may drive the first node ND1 with a power supply voltage VDD level in response to the first control signal $\overline{EN}$. The first driver 530 may include a first PMOS transistor PM1 which is coupled between a power supply voltage VDD terminal and the first node ND1 to receive the first control signal $\overline{EN}$ through a gate.

The second driver 540 may drive the second node ND2 with the power supply voltage VDD level in response to the corresponding second control signal TM<0> among the second control signals TM<0:7>. The second driver 540 may include a second PMOS transistor PM2 that is coupled between the power supply voltage VDD terminal and the second node ND2 to receive the corresponding second control signal TM<0> through a gate.

The signal combining unit 550 may combine the signals of the first node ND1 and the second node ND2 to produce a combined signal and output the combined signal to the corresponding channel CH0. The signal combining unit 550 may include a NAND gate that receives the signals from the first node ND1 and the second node ND2 and performs a logical operation.

When the test enable signal EN is deactivated during a normal operation, the test control circuit 410 may deactivate all of the second control signals TM<0:7> while generating the first control signal $\overline{EN}$ at a logic high level. In response to the first control signal $\overline{EN}$ of the logic high level, the first transmitter 510 may transmit the data PHY_DQ<0:3> to the first node ND1 and the first driver 530 may be turned off. On the other hand, the second control signals TM<0:7> may be disabled, and the second transmitter 520 may block the transfer of the test data DA_DQ<0:3>, and the second driver 540 may drive the second node ND2 with the power supply voltage VDD level. Therefore, the signal of the second node ND2 may have a logic high level, and the signal combining unit 550 may transfer the data PHY_DQ<0:3> of the first node ND1 to the corresponding channel CH0.

During a test operation, when the test enable signal EN is activated, the test control circuit 410 may generate the first control signal $\overline{EN}$ at a logic low level. In response to the first control signal $\overline{EN}$ of the logic low level, the first transmitter 510 may block the transfer of the data PHY_DQ<0:3>, and the first driver 530 may drive the first node ND1 with the power supply voltage VDD level.

Herein, when the test control circuit 410 selects and deactivates the corresponding second control signal TM<0> among the second control signals TM<0:7>, the second transmitter 520 may block the transfer of the test data DA_DQ<0:3>, and the second driver 540 may drive the second node ND2 with the power supply voltage VDD level. Accordingly, the signals of the first node ND1 and the second node ND2 may all have a logic high level, and the signal combining unit 550 may transfer the data that are set to a logic low level to the corresponding channel CH0.

When the test control circuit 410 selects another second control signal among the second control signals TM<0:7> and activates the corresponding second control signal TM<0>, the second transmitter 520 may transmit the test data DA_DQ<0:3> to the second node ND2, and the second driver 540 may be turned off. Therefore, the signal of the first node ND1 may have a logic high level, and the signal combining unit 550 may transfer the test data DA_DQ<0:3> of the second node ND2 to the corresponding channel CH0.

Figure 6:
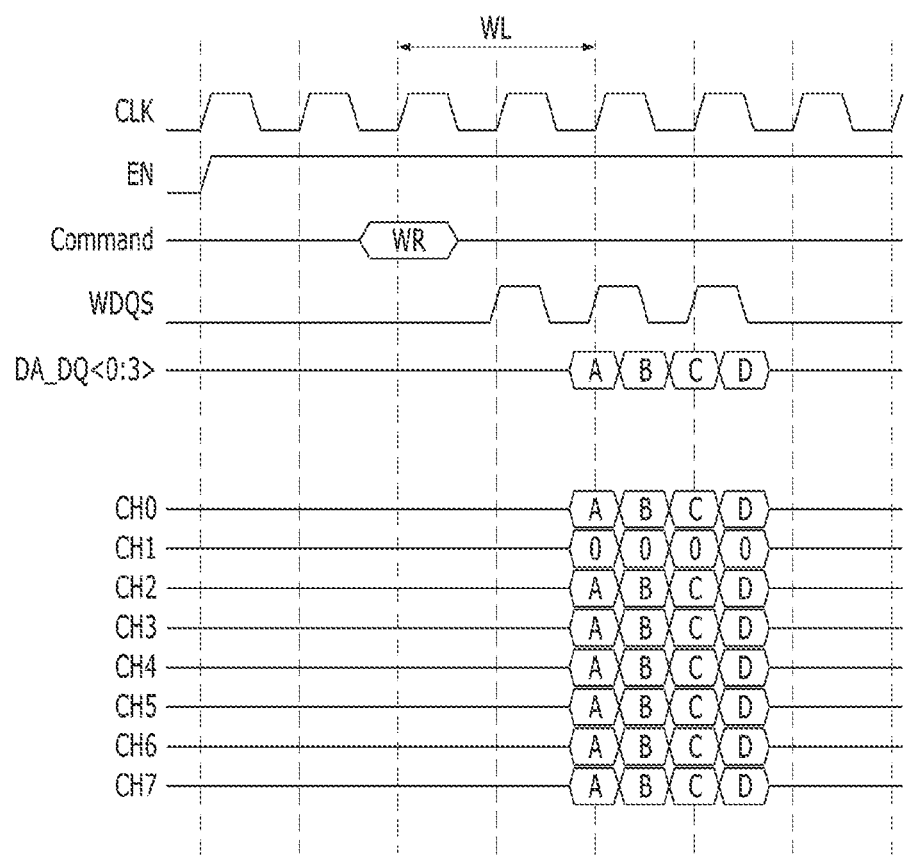
FIG. 6 is a signal waveform diagram illustrating an operation of a memory device in accordance with an embodiment of the present disclosure.

FIG. 6 is a signal waveform diagram illustrating an operation of the memory device 400 in accordance with an embodiment of the present disclosure.

When the memory device 400 enters a test mode, the test enable signal EN may be activated. Subsequently, after a write latency WL according to a write command WR directing a write operation, the memory device 400 may be synchronized with a data strobe signal WDQS to receive the test data DA_DQ<0:3> through the test data input pad 430.

The test control circuit 410 may deactivate the first control signal $\overline{EN}$ by inverting the activated test enable signal EN. Accordingly, the first transmitter of each of the data input circuits 440 to 447 may block the transfer of the data PHY_DQ<0:31>, and the first driver of each of the data input circuits 440 to 447 may drive the first node with the power supply voltage VDD level.

Herein, as illustrated as an example in FIG. 6, the test control circuit 410 may select and deactivate a second signal among the second control signals TM<0:7> according to the test mode information TM. Accordingly, among the data input circuits 440 to 447, the second transmitter of the second data input circuit may block the transfer of the test data A, B, C, and D, and the second driver of the second data input circuit may drive the second node with the power supply voltage VDD level. As a result, the second data input circuit of the data input circuits 440 to 447 may transmit data that are set to a logic low level 0 to the corresponding channel CH1.

The test control circuit 410 may activate the other second control signals except the selected second control signal among the second control signals TM<0:7>. Therefore, in the other data input circuits except the second data input circuit among the data input circuits 440 to 447, the second transmitter may transmit the test data A, B, C, and D to the second node, and the second driver may be turned off. As a result, the other data input circuits except the second data input circuit among the data input circuits 440 to 447 may transmit the test data A, B, C, and D to the corresponding channels CH0 and CH2 to CH7.

The memory device 400 in accordance with an embodiment of the present disclosure may be able to mask some data based on the test mode information TM and transfer set data by copying data received by the test input pad 430 and transferring the copied data to the channels CH0 to CH7. The memory device 400 may be able to transfer data of a pattern that is set according to a test operation to the channels CH0 to CH7. Accordingly, result data according to various operations of the memory device 400 may be predicted, and the coverage of an operation that may be tested may be increased.

According to an embodiment of the present disclosure, a memory device may be tested by copying data received through a limited number of test input pads, thereby minimizing the number of the test input pads and increasing the efficiency of a test operation. Also, when the received data are copied, the copied data may be set in diverse patterns to test diverse operations of the memory device.

For example, a plurality of data input circuits that receive and copy data may be selectively disabled according to test mode information. That is, it is possible to selectively mask some data that are copied by the data input circuits. Accordingly, the pattern of data generated by various operations of the memory device, such as an Error Correction Code (ECC) operation, etc., may also be predicted by using data of a desired pattern, thereby increasing the coverage of the test operation.

Figure 7:
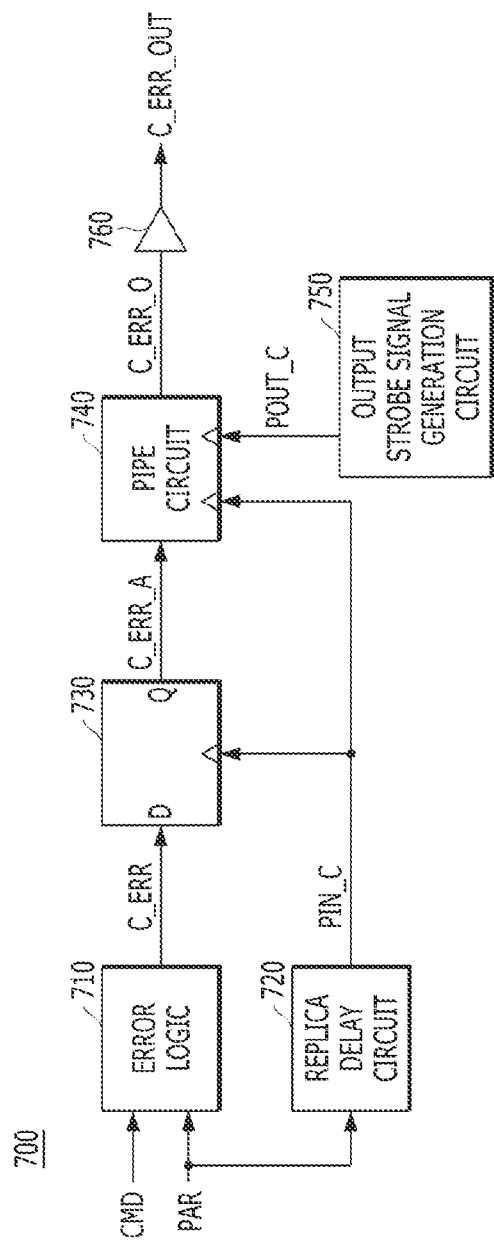
FIG. 7 is a block diagram illustrating a memory device in accordance with an embodiment of the present disclosure.

FIG. 7 is a block diagram illustrating a memory device 700 in accordance with an embodiment of the present disclosure. FIG. 7 illustrates configurations related to determining whether an error is present in a command.

Referring to FIG. 7, the memory device 700 may include error logic unit 710, a replica delay circuit 720, an alignment circuit 730, a pipe circuit 740, an output strobe signal generation circuit 750 and a transmitter 760. The error logic unit 710 may include all circuits, systems, software, firmware and devices necessary for their respective operations and functions.

The error logic unit 710 may determine whether an error is present in a command CMD applied to the memory device 700, and generate a command error signal C_ERR indicating whether an error is present in the command CMD. The error logic unit 710 may determine whether an error is present in the command CMD, by using the command CMD and a parity signal PAR. The command CMD may include multi-bit signals, and the error logic unit 710 may determine whether an error is present in the command CMD, depending on whether the number of signals each having a value of "1" among the signals included in the command CMD and the parity signal PAR is even or odd. For example, under the condition that the command CMD is encoded to have the number of signals each having the value of "1" is an even number together with the parity signal PAR, when the number of signals each having the value of "1" among the signals included in the command CMD and the parity signal PAR is odd, the error logic unit 710 may determine that an error is present in the command CMD.

The replica delay circuit 720 is a circuit that replicates a delay value of the error logic unit 710. The replica delay circuit 720 may delay a strobe signal, i.e., the parity signal PAR, of the command CMD inputted to the error logic unit 710, and generate an input strobe signal PIN_C. In this disclosure, the parity signal PAR is illustrated as the strobe signal of the command CMD, but any signal having information on timing at which the command CMD is inputted to the error logic unit 710 may also be the strobe signal of the command CMD, besides the parity signal PAR. The input strobe signal PIN_C generated by the replica delay circuit 720 may be a signal activated at a time point at which the error logic unit 710 generates and outputs an error signal C_ERR. For example, the replica delay circuit 720 may delay a signal having the same timing as the command CMD by the same delay value as the error logic unit 710, and then combine the delayed signal with a clock to generate the input strobe signal PIN_C. That is, the replica delay circuit 720 may generate the input strobe signal PIN_C activated at a time point at which the strobe signal is delayed by the delay value of the error logic unit 710 from a time point at which the command CMD is inputted to the error logic unit 710.

The alignment circuit 730 may align and output the command error signal C_ERR by using the input strobe signal PIN_C. The alignment circuit 730 may be a D flip-flop that receives the input strobe signal PIN_C through a clock terminal and the command error signal C_ERR through a D terminal. Since the alignment circuit 730 is a circuit used to align the command error signal C_ERR once and transmit the aligned command error signal to the pipe circuit 740, the alignment circuit 730 may not be included in the memory device 700 and may be omitted. The command error signal outputted from the alignment circuit 730 is denoted by "C_ERR_A".

The output strobe signal generation circuit 750 may generate an output strobe signal POUT_C. The output strobe signal POUT_C may be a signal activated after command error latency elapses from a time point at which the memory device 700 receives the command CMD. That is, the output strobe signal POUT_C may be a signal activated at a time point at which a command error signal C_ERR_OUT is supposed to be outputted.

The pipe circuit 740 may receive and store the command error signal C_ERR_A in response to the activation of the input strobe signal PIN_C, and output a command error signal C_ERR_O, which is stored therein, in response to the activation of the output strobe signal POUT_C. That is, the pipe circuit 740 may receive and store the command error signal C_ERR_A at a time point at which the command error signal C_ERR is generated by the error logic unit 710, and output the stored command error signal C_ERR_O at the time point at which the command error signal C_ERR_OUT is supposed to be outputted.

The transmitter 760 may output the command error signal C_ERR_O, which is outputted from the pipe circuit 740, to the outside of the memory device 700. That is, the command error signal C_ERR_OUT outputted from the transmitter 760 may be transmitted to a memory controller.

Figure 8:
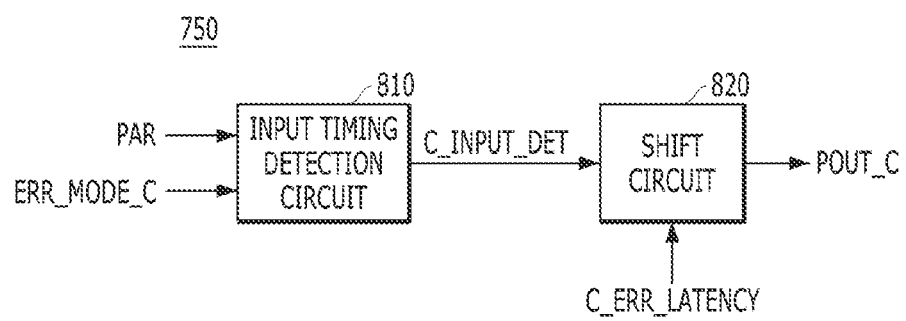
FIG. 8 is a block diagram illustrating an output strobe signal generation circuit shown in FIG. 7 in accordance with an embodiment of the present disclosure.

FIG. 8 is a block diagram illustrating the output strobe signal generation circuit 750 shown in FIG. 7 in accordance with an embodiment of the present disclosure.

Referring to FIG. 8, the output strobe signal generation circuit 750 may include an input timing detection circuit 810 and a shift circuit 820.

The input timing detection circuit 810 may detect input timing of the command CMD, and generate an input detection signal C_INPUT_DET. The parity signal PAR may transition when the command CMD is inputted, and the input timing detection circuit 810 may confirm that the command CMD has been inputted, by detecting the transition of the parity signal PAR, and activate the input detection signal C_INPUT_DET.

A command error mode signal ERR_MODE_C may be a mode signal for determining whether to detect an error present in the command CMD. When the command error mode signal ERR_MODE_C is activated, the memory device 700 may detect the error in the command CMD, and perform an operation of outputting the command error signal C_ERR_OUT. When the command error mode signal ERR_MODE_C is deactivated, the memory device 700 may not detect the error in the command CMD. When the command error mode signal ERR_MODE_C is deactivated, the input timing detection circuit 810 may maintain the input detection signal C_INPUT_DET in a deactivation state regardless of the transition of the parity signal PAR.

The shift circuit 820 may shift the input detection signal C_INPUT_DET by the command error latency, and generate the output strobe signal POUT_C. A predetermined value C_ERR_LATENCY of the command error latency may be inputted to the shift circuit 820. The shift circuit 820 may shift or delay the input detection signal C_INPUT_DET by the predetermined value C_ERR_LATENCY of the command error latency, and generate the output strobe signal POUT_C. The predetermined value C_ERR_LATENCY may be predetermined by the memory controller.

Figure 9:
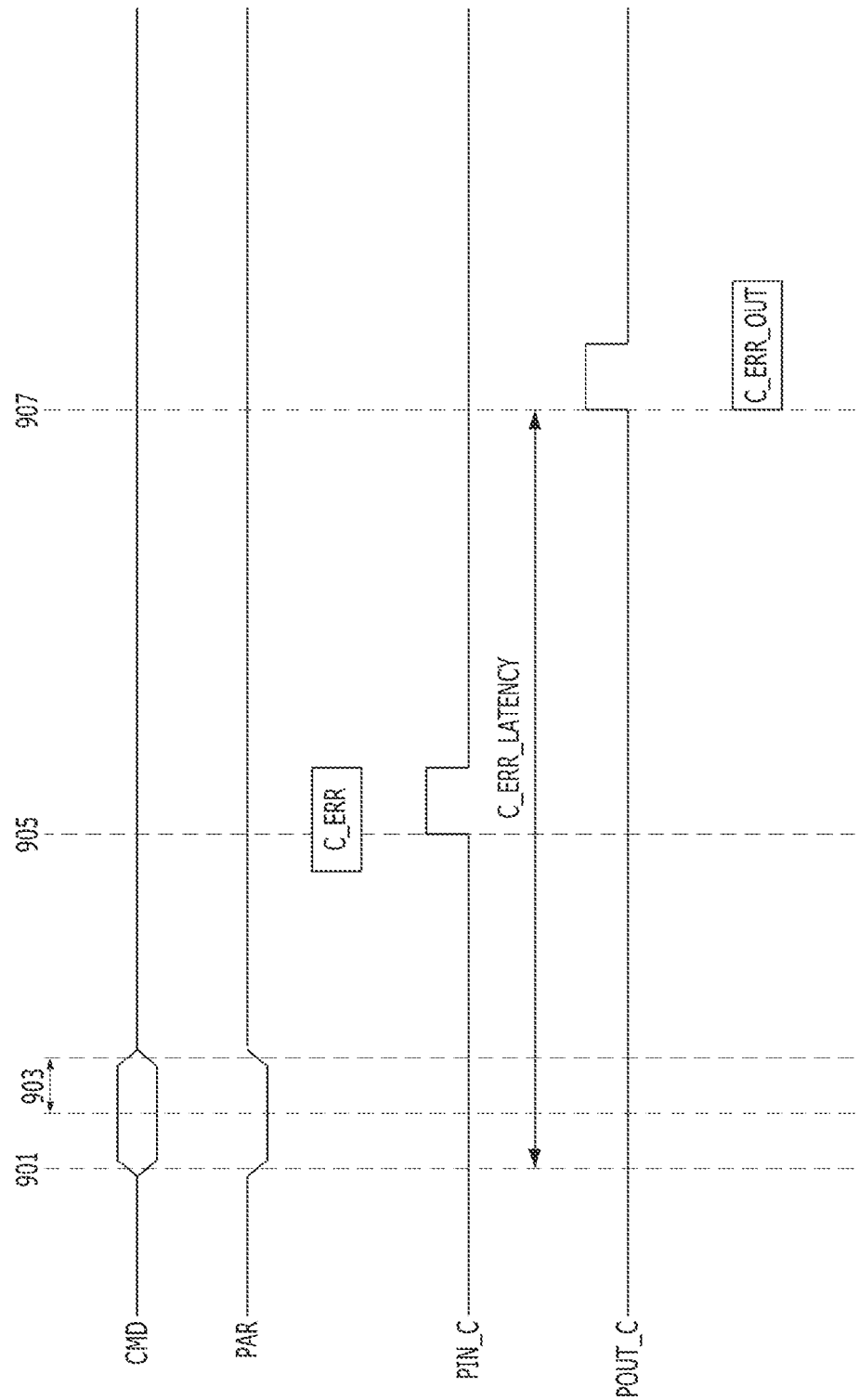
FIG. 9 is a timing diagram illustrating an operation of the memory device shown in FIG. 7 in accordance with an embodiment of the present disclosure.

FIG. 9 is a timing diagram illustrating an operation of the memory device 700 shown in FIG. 7 in accordance with an embodiment of the present disclosure.

Referring to FIG. 9, the command CMD may be applied to the memory device 700 at a time point 901. At the time point 901, it may be notified that the parity signal PAR transitions from "1" to "0", and thus the command CMD is applied to the memory device 700. A logical value of the parity signal PAR in a period 903 after the parity signal PAR transitions to a low level may be used to detect an error in the command CMD. That is, when the parity signal PAR is "1" in the period 903, the error logic unit 710 may recognize the parity signal PAR as "1", and detect an error in the command CMD, and when the parity signal PAR is "0" in the period 903, the error logic unit 710 may recognize the parity signal PAR as "0", and detect an error in the command CMD.

At a time point 905, the command error signal C_ERR may be generated by the error logic unit 710. The command error signal C_ERR may include information on whether or not an error is present in the command CMD. In addition, the input strobe signal PIN_C may be activated to "1" at the time point 905. The pipe circuit 740 may receive and store the command error signal C_ERR=C_ERR_A in response to the activation of the input strobe signal PIN_C.

At a time point 907 after the command error latency C_ERR_LATENCY elapses from the time point 901 at which the command CMD is applied to the memory device 700, the output strobe signal POUT_C may be activated to "1" by the output strobe signal generation circuit 750.

In response to the activated output strobe signal POUT_C, the command error signal C_ERR_O stored in the pipe circuit 740 may be transmitted to the transmitter 760, and the transmitter 760 may output the command error signal C_ERR_OUT to the outside of the memory device 700.

Referring to FIG. 9, it may be seen that the command error signal C_ERR_A is inputted to and stored in the pipe circuit 740 at the time point at which the command error signal C_ERR is generated by the error logic unit 710, and the command error signal C_ERR_OUT stored in the pipe circuit 740 is outputted to the outside of the memory device 700 through the transmitter 760 at the time point at which the command error signal C_ERR_OUT is supposed to be outputted, that is, at the time point 907 after the command error latency C_ERR_LATENCY elapses from the time point 901 at which the command CMD is applied to the memory device 700.

Figure 10:
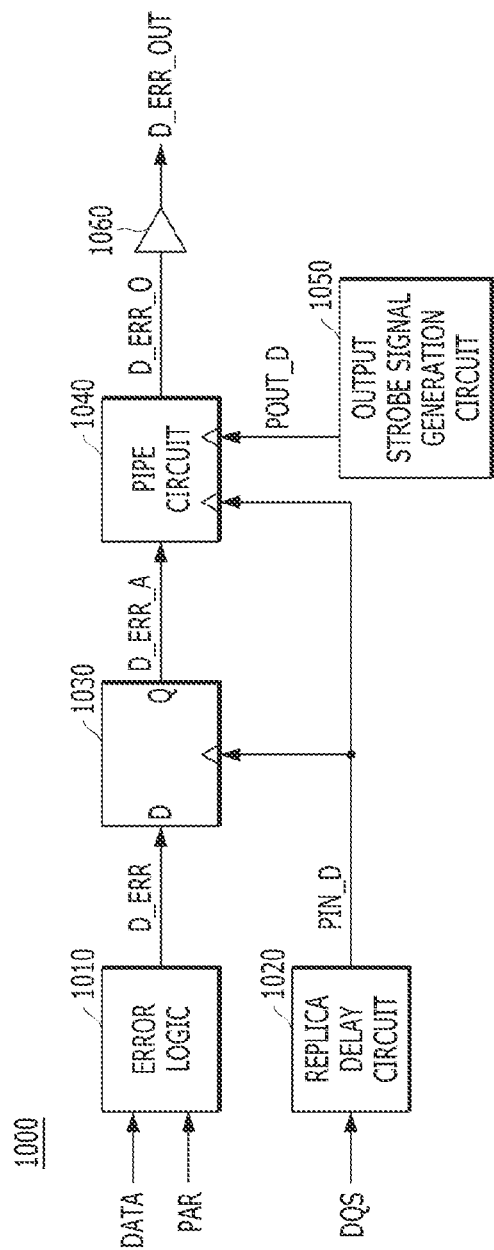
FIG. 10 is a block diagram illustrating a memory device in accordance with an embodiment of the present disclosure.

FIG. 10 is a block diagram illustrating a memory device 1000 in accordance with an embodiment of the present disclosure. FIG. 10 illustrates configurations related to determining whether an error is present in data.

Referring to FIG. 10, the memory device 1000 may include error logic unit 1010, a replica delay circuit 1020, an alignment circuit 1030, a pipe circuit 1040, an output strobe signal generation circuit 1050 and a transmitter 1060.

The error logic unit 1010 may determine whether an error is present in data DATA applied to the memory device 1000, that is, write data received by the memory device 1000 during a write operation, and generate a data error signal D_ERR indicating whether an error is present in the data DATA. The error logic unit 1010 may determine whether an error is present in the data DATA, by using the data DATA and a parity signal PAR. The data DATA may include multi-bit signals, and the error logic unit 1010 may determine whether an error is present in the data DATA, depending on whether the number of signals each having a value of "1" among the signals included in the data DATA and the parity signal PAR is even or odd. For example, under the condition that the data DATA is encoded to have the number of signals each having the value of "1" is predetermined as an even number together with the parity signal PAR, when the number of signals each having the value of "1" among the signals included in the data DATA and the parity signal PAR is odd, the error logic unit 1010 may determine that an error is present in the data DATA.

The replica delay circuit 1020 is a circuit that replicates a delay value of the error logic unit 1010. The replica delay circuit 1020 may delay a strobe signal DQS of the data DATA inputted to the error logic unit 1010, and generate an input strobe signal PIN_D. The strobe signal DQS may start to toggle in a period where the data DATA is inputted to the memory device 1000, and the replica delay circuit 1020 may identify a time point at which the data DATA is applied, by using the strobe signal DQS, and generate the input strobe signal PIN_D activated at a time point at which time equivalent to the delay value of the error logic unit 1010 elapses from the identified time point.

The alignment circuit 1030 may align and output the data error signal D_ERR by using the input strobe signal PIN_D. The alignment circuit 1030 may be a D flip-flop that receives the input strobe signal PIN_D through a clock terminal and the data error signal D_ERR through a D terminal. Since the alignment circuit 1030 is a circuit used to align the data error signal D_ERR once and transmit the aligned data error signal to the pipe circuit 1040, the alignment circuit 1030 may not be included in the memory device 1000 and may be omitted. The data error signal outputted from the alignment circuit 1030 is denoted by "D_ERR_A".

The output strobe signal generation circuit 1050 may generate an output strobe signal POUT_D. The output strobe signal POUT_D may be a signal activated after data error latency elapses from a time point at which the memory device 1000 receives a write command. That is, the output strobe signal POUT_D may be a signal activated at a time point at which a data error signal D_ERR_OUT is supposed to be outputted.

The pipe circuit 1040 may receive and store the data error signal D_ERR_A in response to the activation of the input strobe signal PIN_D, and output a data error signal D_ERR_O, which is stored therein, in response to the activation of the output strobe signal POUT_D. That is, the pipe circuit 1040 may receive and store the data error signal D_ERR_A at a time point at which the data error signal D_ERR is generated by the error logic unit 1010, and output the stored data error signal D_ERR_O at the time point at which the data error signal D_ERR_O is supposed to be outputted.

The transmitter 1060 may output the data error signal D_ERR_O, which is outputted from the pipe circuit 1040, to the outside of the memory device 1000. That is, the data error signal D_ERR_OUT outputted from the transmitter 1060 may be transmitted to a memory controller.

Figure 11:
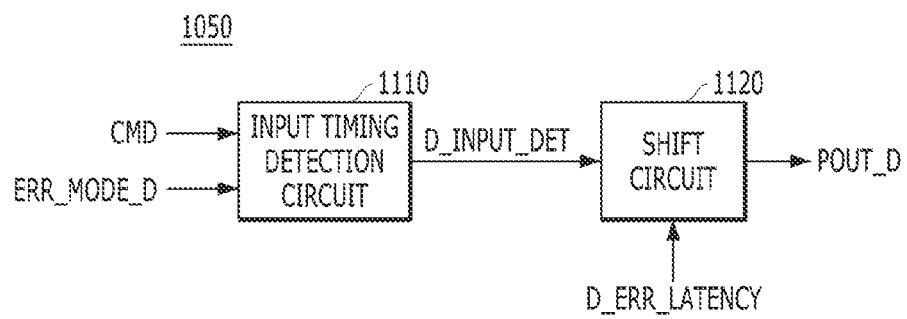
FIG. 11 is a block diagram illustrating an output strobe signal generation circuit shown in FIG. 10 in accordance with an embodiment of the present disclosure.

FIG. 11 is a block diagram illustrating the output strobe signal generation circuit 1050 shown in FIG. 10 in accordance with an embodiment of the present disclosure.

Referring to FIG. 11, the output strobe signal generation circuit 1050 may include an input timing detection circuit 1110 and a shift circuit 1120.

The input timing detection circuit 1110 may detect whether the write command is applied, and generate an input detection signal D_INPUT_DET. The input timing detection circuit 1110 may detect whether the write command is applied, by decoding the command CMD, and activate the input detection signal D_INPUT_DET when the write command is applied.

A data error mode signal ERR_MODE_D may be a mode signal for determining whether to detect an error present in the data DATA. When the data error mode signal ERR_MODE_D is activated, the memory device 1000 may detect the error in the data DATA, and perform an operation of outputting the data error signal D_ERR_OUT. When the data error mode signal ERR_MODE_D is deactivated, the memory device 1000 may not detect the error in the data DATA. When the data error mode signal ERR_MODE_D is deactivated, the input timing detection circuit 1110 may maintain the input detection signal D_INPUT_DET in a deactivation state regardless of the application of the write command.

The shift circuit 1120 may shift the input detection signal D_INPUT_DET by the data error latency, and generate the output strobe signal POUT_D. A predetermined value D_ERR_LATENCY of the data error latency may be inputted to the shift circuit 1120. The shift circuit 1120 may shift or delay the input detection signal D_INPUT_DET by the predetermined value D_ERR_LATENCY of the data error latency, and generate the output strobe signal POUT_D. The predetermined value D_ERR_LATENCY may be predetermined by the memory controller.

Figure 12:
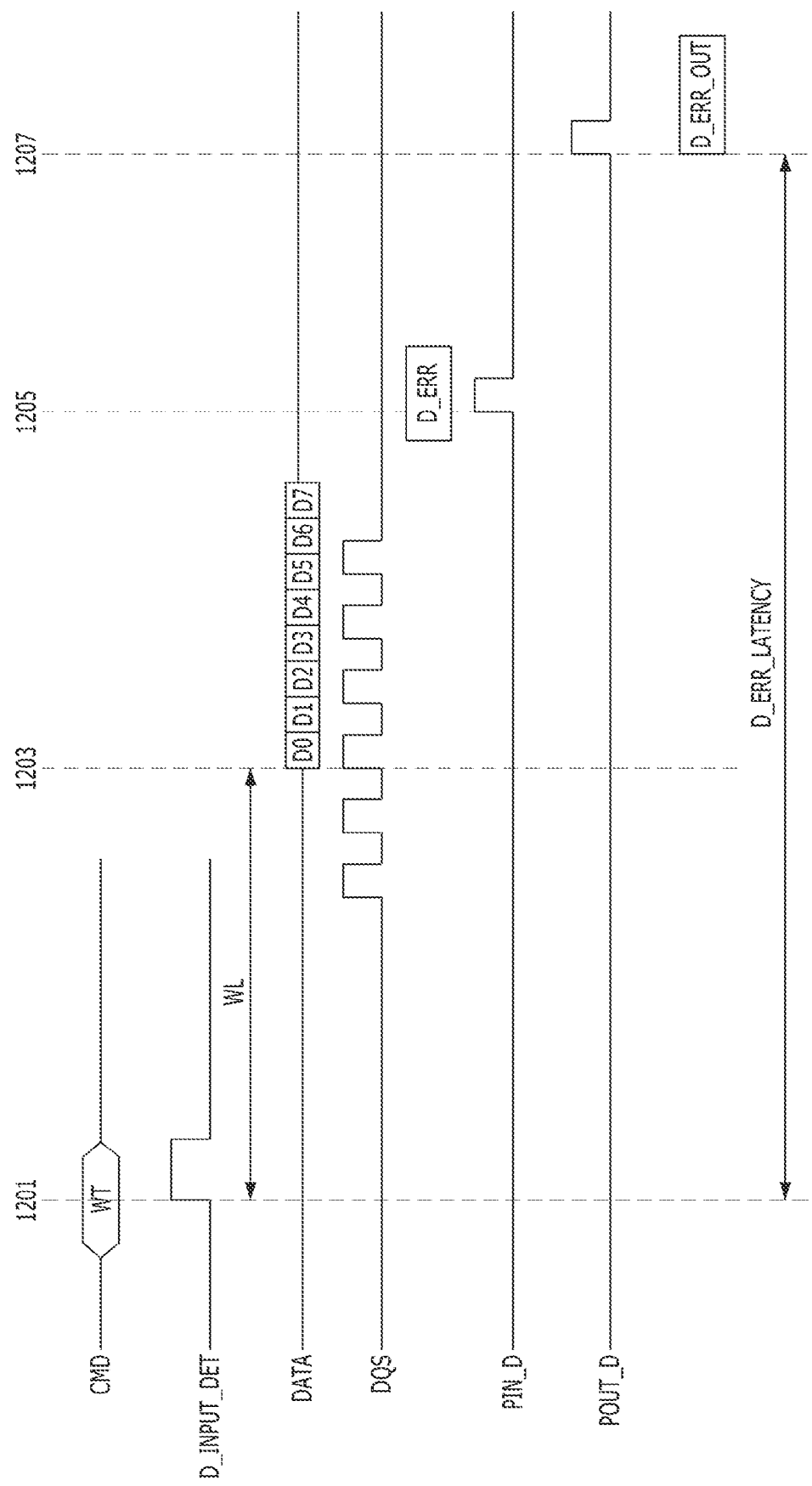
FIG. 12 is a timing diagram illustrating an operation of the memory device shown in FIG. 10 in accordance with an embodiment of the present disclosure.

FIG. 12 is a timing diagram illustrating an operation of the memory device 1000 shown in FIG. 10 in accordance with an embodiment of the present disclosure.

Referring to FIG. 12, the write command WT may be applied to the memory device 1000 at a time point 1201. The input timing detection circuit 1010 may check that the write command WT has been applied, by decoding the command CMD, and activate the input detection signal D_INPUT_DET.

The data DATA may start to be applied to the memory device 1000 from a time point 1203 after write latency WL elapses from the time point 1201. D0 to D7 may represent the data DATA applied to the memory device 1000. The data strobe signal DQS may toggle together with the application of the data DATA. The data D0 to D7 may be applied from the time point 1203 at which the data strobe signal DQS is activated for the third time, and the replica delay circuit 1020 may determine that the data DATA has been inputted at the time point 1203 at which the data strobe signal DQS is activated for the third time, and activate the input strobe signal PIN_D at a time point 1205 after time corresponding to the delay value of the error logic unit 1010 elapses from the identified time point 1203.

At the time point 1205, the data error signal D_ERR may be generated by the error logic unit 1010, and the pipe circuit 1040 may receive and store the data error signal D_ERR=D_ERR_A in response to the input strobe signal PIN_D activated at the time point 1205.

At a time point 1207 after the data error latency D_ERR_LATENCY elapses from the time point 1201 at which the write command WT is applied to the memory device 1000, that is, a time point at which the input detection signal D_INPUT_DET is activated, the output strobe signal POUT_D may be activated to "1" by the output strobe signal generation circuit 1050.

In response to the activated output strobe signal POUT_D, the data error signal D_ERR_O stored in the pipe circuit 1040 may be transmitted to the transmitter 1060, and the transmitter 1060 may output the data error signal D_ERR_OUT to the outside of the memory device 1000.

Referring to FIG. 12, it may be seen that the data error signal D_ERR_A is inputted to and stored in the pipe circuit 1040 at the time point 1205 at which the data error signal D_ERR is generated by the error logic unit 1010, and the data error signal D_ERR_O stored in the pipe circuit 1040 is outputted to the outside of the memory device 1000 through the transmitter 1060 at the time point at which the data error signal D_ERR is supposed to be outputted, that is, at the time point 1207 after the data error latency D_ERR_LATENCY elapses from the time point 1201 at which the write command WT is applied to the memory device 1000.

Figure 13:
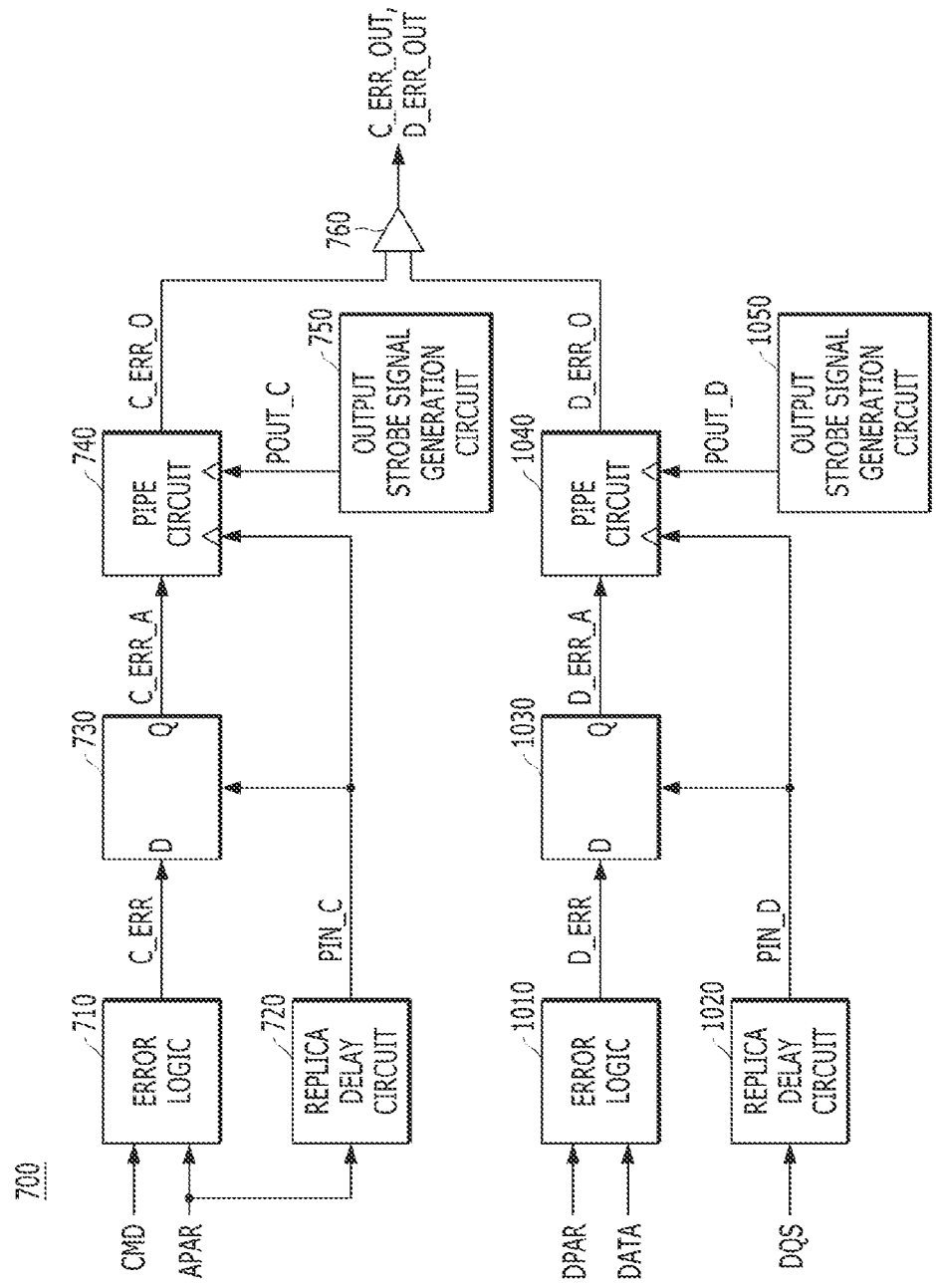
FIG. 13 is a block diagram illustrating a memory device in accordance with an embodiment of the present disclosure.

FIG. 13 is a block diagram illustrating a memory device 1300 in accordance with an embodiment of the present disclosure. FIG. 13 illustrates configurations related to determining whether an error is present in a command, and configurations related to determining whether an error is present in data.

Referring to FIG. 13, the memory device 1300 may include command error logic unit 710, a command replica delay circuit 720, a command alignment circuit 730, a command pipe circuit 740 and a command output strobe signal generation circuit 750 as configurations related to determining whether an error is present in a command CMD. The word "command" is added to each of the names of the configurations 710, 720, 730, 740 and 750 so as to be distinguished from configurations 1010, 1020, 1030, 1040 and 1050 related to determining whether an error is present in data DATA, and the configurations 710, 720, 730, 740 and 750 may be the same as the configurations 710, 720, 730, 740 and 750 shown in FIG. 7, respectively.

In addition, the memory device 1300 may include data error logic unit 1010, a data replica delay circuit 1020, a data alignment circuit 1030, a data pipe circuit 1040 and a data output strobe signal generation circuit 1050 as configurations related to determining whether an error is present in the data DATA. The word "data" is added to each of the names of the configurations 1010, 1020, 1030, 1040 and 1050 so as to be distinguished from the configurations 710, 720, 730, 740 and 750 related to determining whether an error is present in the command CMD, and the configurations 1010, 1020, 1030, 1040 and 1050 may be the same as the configurations 1010, 1020, 1030, 1040 and 1050 shown in FIG. 10, respectively.

The transmitter 760 may transmit a command error signal C_ERR_OUT and a data error signal D_ERR_OUT to a memory controller. Since a period in which the memory device 1300 outputs the command error signal C_ERR_OUT and a period in which the memory device 1300 outputs the data error signal D_ERR_OUT are different from each other, it may be possible for one transmitter 760 to output the command error signal C_ERR_OUT and the data error signal C_ERR_OUT.

In FIG. 13, parity signals are denoted by reference symbols "APAR" and "DPAR" so that a parity signal APAR used for the command CMD may be distinguished from a parity signal DPAR used for the data DATA. As illustrated in FIG. 13, the parity signals APAR and DPAR may be present separately for a command and for data.

Figure 14:
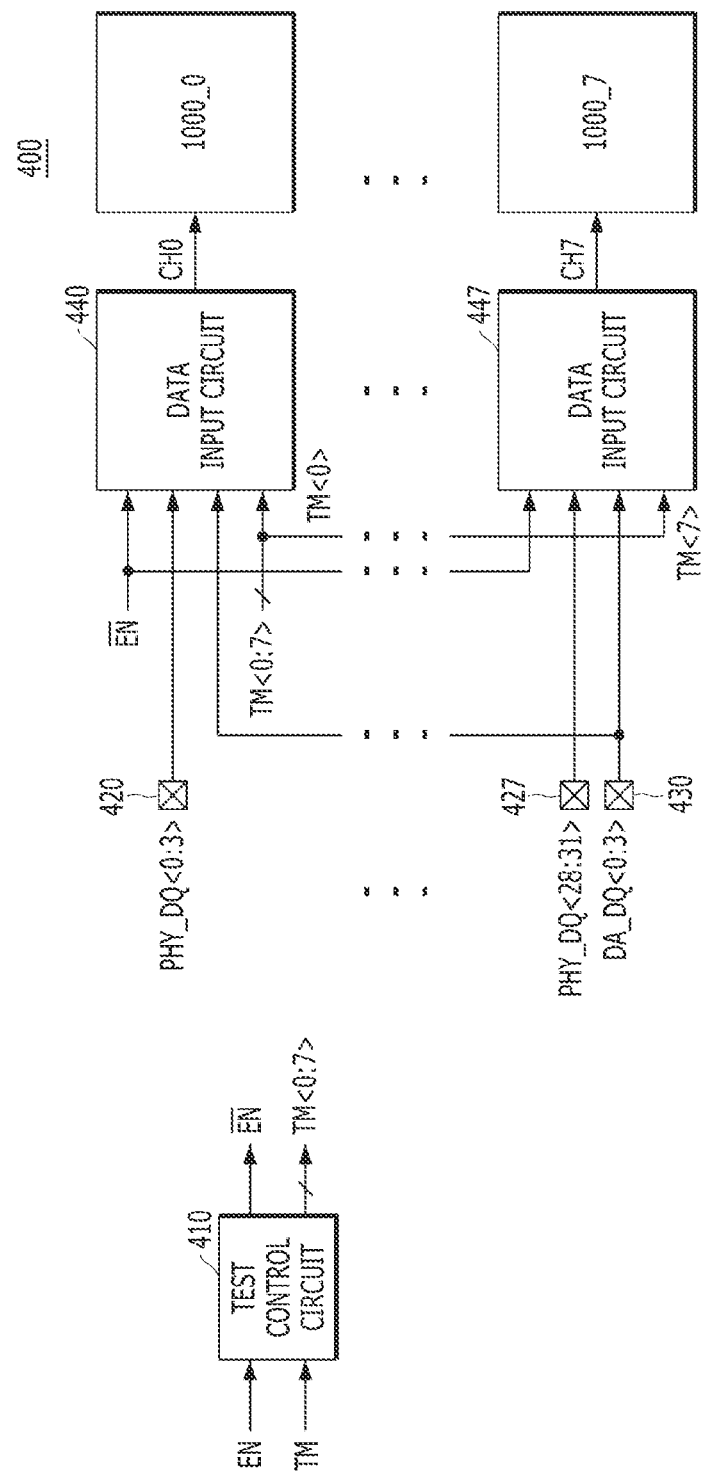
FIG. 14 is a block diagram illustrating a connection relationship between the memory device shown in FIG. 4 and the memory device shown in FIG. 10 in accordance with an embodiment of the present disclosure.

FIG. 14 is a block diagram illustrating a connection relationship between the memory device 400 shown in FIG. 4 and the memory device 1000 shown in FIG. 10 in accordance with an embodiment of the present disclosure.

Referring to FIG. 14, the configurations 1010, 1020, 1030, 1040, 1050 and 1060 shown in FIG. 10 may be included in each of the channels CH0 to CH7 shown in FIG. 4. Configurations 1000_0 to 1000_7 may each indicate the configurations 1010, 1020, 1030, 1040, 1050 and 1060 included in each of the channels CH0 to CH7. For example, the configuration 1000_0 may indicate the configurations 1010, 1020, 1030, 1040, 1050 and 1060 included in the channel CH0, and the configuration 1000_3 may indicate the configurations 1010, 1020, 1030, 1040, 1050 and 1060 included in the channel CH3.

The error logic unit 1010 of the configuration 1000_0 may receive data, which is transmitted to the channel CH0, from the data input circuit 440, and determine whether an error is present in the data. In addition, the error logic unit 1010 of the configuration 1000_7 may receive data, which is transmitted to the channel CH7, from the data input circuit 447, and determine whether an error is present in the data.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A memory device comprising:
   an error logic unit configured to determine whether an error is present in command signals to generate a command error signal;
   a replica delay circuit configured to replicate a delay value of the error logic unit and generate an input strobe signal by delaying a strobe signal of the command signals;
   an output strobe signal generation circuit configured to generate an output strobe signal activated after a command error latency elapses from a time point at which the command signals are received; and
   a pipe circuit configured to receive and store the command error signal in response to the input strobe signal and output the stored command error signal in response to the output strobe signal.

2. The memory device of claim 1, further comprising a transmitter configured to output the command error signal, which is outputted from the pipe circuit, to an outside of the memory device.

3. The memory device of claim 1, wherein the output strobe signal generation circuit includes:

an input timing detection circuit configured to detect input of the command signals to generate an input detection signal; and
a shift circuit configured to shift the input detection signal by the command error latency to generate the output strobe signal.

4. The memory device of claim 1, further comprising an alignment circuit configured to align the command error signal, which is provided from the error logic unit to the pipe circuit, with the input strobe signal.

5. The memory device of claim 1, wherein the strobe signal of the command signals is generated using a parity signal.

6. The memory device of claim 1, wherein the output strobe signal generation circuit is further configured to detect the time point at which the command signals are received, by using a parity signal of the command.

7. A memory device comprising:
an error logic unit configured to determine whether an error is present in data to generate a data error signal;
a replica delay circuit configured to replicate a delay value of the error logic unit and generate an input strobe signal by delaying a strobe signal of the data;
an output strobe signal generation circuit configured to generate an output strobe signal activated after a data error latency elapses from a time point at which a write command corresponding to the data is received; and
a pipe circuit configured to receive and store the data error signal in response to the input strobe signal and output the stored data error signal in response to the output strobe signal.

8. The memory device of claim 7, further comprising a transmitter configured to output the data error signal, which is outputted from the pipe circuit, to an outside of the memory device.

9. The memory device of claim 7, wherein the output strobe signal generation circuit includes:
an input timing detection circuit configured to detect input of the write command to generate an input detection signal; and
a shift circuit configured to shift the input detection signal by the data error latency to generate the output strobe signal.

10. The memory device of claim 7, further comprising an alignment circuit configured to align the data error signal, which is provided from the error logic unit to the pipe circuit, with the input strobe signal.

11. A memory device comprising:
a command error logic unit configured to determine whether an error is present in command signals to generate a command error signal;
a command replica delay circuit configured to replicate a delay value of the command error logic unit and generate a command input strobe signal by delaying a strobe signal of the command signals;
a command output strobe signal generation circuit configured to generate a command output strobe signal activated after a command error latency elapses from a time point at which the command signals are received;
a command pipe circuit configured to receive and store the command error signal in response to the command input strobe signal and output the stored command error signal in response to the command output strobe signal;
a data error logic unit configured to determine whether an error is present in data, and generating a data error signal;
a data replica delay circuit configured to replicate a delay value of the data error logic unit and generate a data input strobe signal by delaying a strobe signal of the data;
a data output strobe signal generation circuit configured to generate a data output strobe signal activated after a data error latency elapses from a time point at which a write command corresponding to the data is received; and
a data pipe circuit configured to receive and store the data error signal in response to the data input strobe signal and output the stored data error signal in response to the data output strobe signal.

12. The memory device of claim 11, further comprising a transmitter configured to output the command error signal, which is outputted from the command pipe circuit, and the data error signal, which is outputted from the data pipe circuit, to an outside of the memory device.

13. A memory device comprising:
a plurality of channel regions;
a plurality of data input pads and at least one test data input pad;
a plurality of data input circuits corresponding to the respective channel regions and each configured to transfer data from the plurality of data input pads to a corresponding channel region of the channel regions; and
a test control circuit configured to select at least one of the plurality of data input circuits according to test mode information and control the selected data input circuit to transmit the data to a corresponding channel region of the channel regions, during a test operation,
wherein at least one of the plurality of channel regions includes:
an error logic unit configured to determine whether an error is present in the data transmitted thereto to generate a data error signal;
a replica delay circuit configured to replicate a delay value of the error logic unit and generate an input strobe signal by delaying a strobe signal of the data transmitted thereto;
an output strobe signal generation circuit suitable for generating an output strobe signal activated after a data error latency elapses from a time point at which a write command corresponding to the data transmitted thereto is received; and
a pipe circuit configured to receive and store the data error signal in response to the input strobe signal and output the stored data error signal in response to the output strobe signal.

14. The memory device of claim 13, wherein the at least one channel region further includes a transmitter configured to output the data error signal, which is outputted from the pipe circuit, to an outside of the memory device.

15. The memory device of claim 13, wherein the output strobe signal generation circuit includes:
an input timing detection circuit configured to detect input of the write command to generate an input detection signal; and
a shift circuit configured to shift the input detection signal by the data error latency to generate the output strobe signal.

16. The memory device of claim 13, wherein the at least one channel region further includes an alignment circuit configured to align the data error signal, which is provided from the error logic unit to the pipe circuit, with the input strobe signal.

\* \* \* \* \*